(12) United States Patent
Mattsson et al.

(10) Patent No.: US 6,377,116 B1
(45) Date of Patent: Apr. 23, 2002

(54) PRE-DISTORTER AND CORRESPONDING METHOD FOR DERIVING SAME

(75) Inventors: S. Anders Mattsson, Maineville, OH (US); Steve F. Russell, Ames, IA (US)

(73) Assignee: Iowa State University Research Foundation, Inc., Ames, IA (US)

(*) Notice: Subject to any disclaimer, the term of this patent is extended or adjusted under 35 U.S.C. 154(b) by 0 days.

(21) Appl. No.: 09/566,642

(22) Filed: May 8, 2000

(51) Int. Cl.[7] ............................................. H03F 1/26
(52) U.S. Cl. ............................................ 330/2; 330/149
(58) Field of Search ................... 330/2, 149; 375/296, 375/297

(56) References Cited

U.S. PATENT DOCUMENTS

| | | | | |
|---|---|---|---|---|
| 5,867,065 A | * | 2/1999 | Leyendecker | 330/149 |
| 5,923,712 A | * | 7/1999 | Leyendecker et al. | 375/297 |
| 6,118,335 A | * | 9/2000 | Nielson et al. | 330/2 |
| 6,141,390 A | * | 10/2000 | Cova | 375/297 |

OTHER PUBLICATIONS

Maria–Gabriella Di Benedetto and Paolo Mandarini, "A new analog predistortion criterion with application to high efficiency digital radio links," *IEEE Transactions on Communications*, vol.43, No. 12, pp. 2966–2974, Dec. 1995.

Giovanni Lazzarin, Silvano Pupolin and Augusto Sarti, "Nonlinearity compensation in digital radio systems," *IEEE Transactions on Communications*, vol. 42, No. 2/3/4, pp. 988–999, Feb./Mar./Apr. 1994.

Aldo N. D'Andrea, Vincenzo Lottici and Ruggero Reggiannini, "RF power amplifier linearization through amplitude and phase predistortion," *IEEE Transactions on Communications*, vol. 44, No. 11, pp. 1477–1484, Nov. 1996.

(List continued on next page.)

*Primary Examiner*—Steven J. Mottola
(74) *Attorney, Agent, or Firm*—Flehr Hohbach Test Albritton & Herbert; R. Michael Ananian, Esq.

(57) ABSTRACT

A method of deriving a pre-distorter for a corresponding non-linear amplifier is disclosed. The first step of the method is to form the pre-distorter's topology. This is done by first determining a corresponding inverse topology to the non-linear amplifier's topology. The non-linear amplifier has a topology comprising filter and non-linear amplifier elements. The inverse topology comprises corresponding inverse filter and amplifier elements to the amplifier's filter and non-linear amplifier elements. Then, those of the inverse filter and amplifier elements for which compensation with the pre-distorter is desired are selected. Any of the inverse filter and amplifier elements that were not selected are then removed from the inverse topology to form the pre-distorter's topology. Thus, the pre-distorter's topology comprises the selected inverse filter and amplifier elements. After the pre-distorter's topology is determined, a pre-defined input signal is applied to the non-linear amplifier. In response, measurements of selected signals of the non-linear amplifier are made. Once the measurements are made, coefficients that define the selected inverse filter and amplifier elements' are estimated. This is done in response to the measurements that were made.

38 Claims, 9 Drawing Sheets

OTHER PUBLICATIONS

Kurt Metzger and Rolf Valentin, "Intersymbol interference due to linear and nonlinear distortion," *IEEE Transactions on Communications,* vol. 44, No. 7, pp. 809–816, Jul. 1996.

Georges Karam and Hikmet Sari, "A data predistortion technique with memory for QAM radio systems," *IEEE Transactions on Communications,* vol. 39, No. 2, pp. 336–344, Feb. 1991.

Georges Karam and Hikmet Sari, "Analysis of predistortion, equalization, and ISI cancellation techniques in Digital radio systems with nonlinear transmit amplifiers," *IEEE Transactions on Communications,* vol. 37, No. 12, pp. 1245–1253, Dec. 1989.

Lars Sundström, Michael Faulkner, and Mats Johansson, "Quantization analysis and design of a digital predistortion lineraizer for RF power amplifiers," *IEEE Transactions on Vehicular technology,* vol. 45, No. 4, pp. 707–719, Nov. 1996.

F.H. Raab and D.J. Rupp, "High efficiency single sideband HF/VHF transmitter based upon envelop elimination and restoration," *IEE, HF Radio Systems and Techniques,* Jul. 4–7 1994, Conference Publication No. 392, pp. 21–25, 1994.

M. Ghaderi, S. Kumar and D.E. Dodds, "Adaptive predistortion lineariser using polynomial functions," *IEE Proceedings on Communications,* vol. 141, No. 2, pp. 49–55, Apr. 1994.

\* cited by examiner

US 6,377,116 B1

PRE-DISTORTER AND CORRESPONDING METHOD FOR DERIVING SAME

TECHNICAL FIELD OF THE INVENTION

The present invention relates generally to pre-distortion of an input signal to a non-linear amplifier. In particular, it pertains to a pre-distorter for a non-linear amplifier that does not actually implement the kernels of a Volterra operator used to describe the non-linear amplifier nor the inverse kernel of the first kernel of the Volterra operator.

BACKGROUND OF THE INVENTION

When designing amplifier, the desired goal is to obtain an amplifier without any distortion. This is practically impossible to do because some of the components, such as transistors, tubes, etc., used in an amplifier are non-linear. Furthermore, the capacitors and inductors used in an amplifier cause frequency dependent distortion. For an RF (i.e., radio frequency) amplifier, this results in two different effects. One effect is that the output signal is distorted at the carrier frequency and the other effect is that there are harmonics in the output signal at multiples of the carrier frequency. In order to deal with such distortion, the input signal can be pre-distorted (i.e., pre-shaped) with a pre-distorter before it is sent to the nonlinear amplifier.

To derive a corresponding pre-distorter for a non-linear amplifier, a standard approach is to describe the amplifier in terms of a Volterra operator . The advantage to doing so is that, given that the inverse kernel of the first kernel of the Volterra operator for the non-linear amplifier exists, the corresponding pre-distorter can be derived by describing it in terms of yet another Volterra operator. A good discussion of Volterra operators can be found in Schetzen, Martin, *The Volterra and Wiener Theories Of Nonlinear Systems*, John Wiley & Sons, New York, 1980, which is incorporated by reference herein.

The Volterra operator for a pre-distorter derived using this approach will be in terms of the kernels of the Volterra operator for the corresponding non-linear amplifier and the inverse kernel of the first kernel of the Volterra operator for the nonlinear amplifier. Unfortunately, this means that a pre-distorter will have to implement these kernels. As evidenced in *The Volterra and Wiener Theories Of Nonlinear Systems*, this is very messy and impractical since determining the kernels is in general awkward and, as the order increases, the practical implementation of the kernels becomes excessively complicated. Therefore, there is a need for an efficient method for deriving pre-distorters, particularly those with high orders, that do not actually implement these kernels.

SUMMARY OF THE INVENTION

In summary, the present invention comprises a method of deriving a pre-distorter for a corresponding non-linear amplifier. The present invention also comprises the pre-distorter itself.

The first step of the method is to define the pre-distorter's topology. This is done by first determining a corresponding inverse topology to the non-linear amplifier's topology. The non-linear amplifier has a topology comprising filter and non-linear amplifier elements. The inverse topology comprises corresponding inverse filter and amplifier elements to the amplifier's filter and non-linear amplifier elements. Then, each of the filter and non-linear amplifier elements of the amplifier for which compensation with the pre-distorter is desired are identified. Any of the inverse filter and amplifier elements corresponding to one of the filter and non-linear amplifier elements that is not identified is then removed from the inverse topology. This forms the pre-distorter's topology so that it comprises the corresponding inverse filter and amplifier elements to the identified filter and non-linear elements.

The next step of the method is to define the selected inverse filter and amplifier elements' responses. To do so, an input signal is applied to the non-linear amplifier. In response, measurements of selected signals of the nonlinear amplifier are made. Once the measurements are made, coefficients that define the selected inverse filter and amplifier elements' responses are estimated. This is done in response to the measurements that were made.

DETAILED DESCRIPTION OF THE INVENTION

Figure 1:
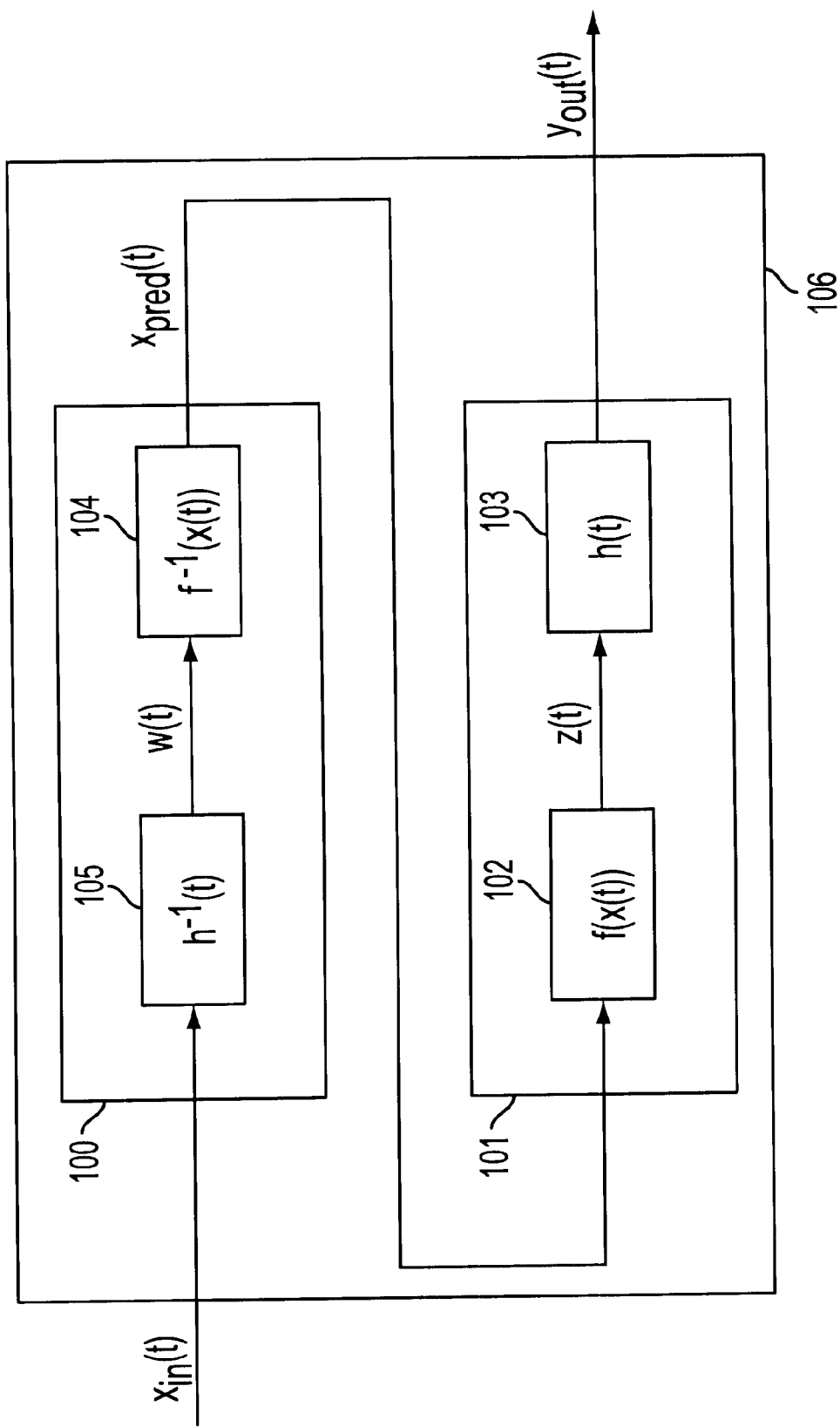
FIGS. 1 to 3 show block diagrams of amplifier systems comprising non-linear amplifiers and corresponding pre-distorters in accordance with the present invention.
Figure 2:
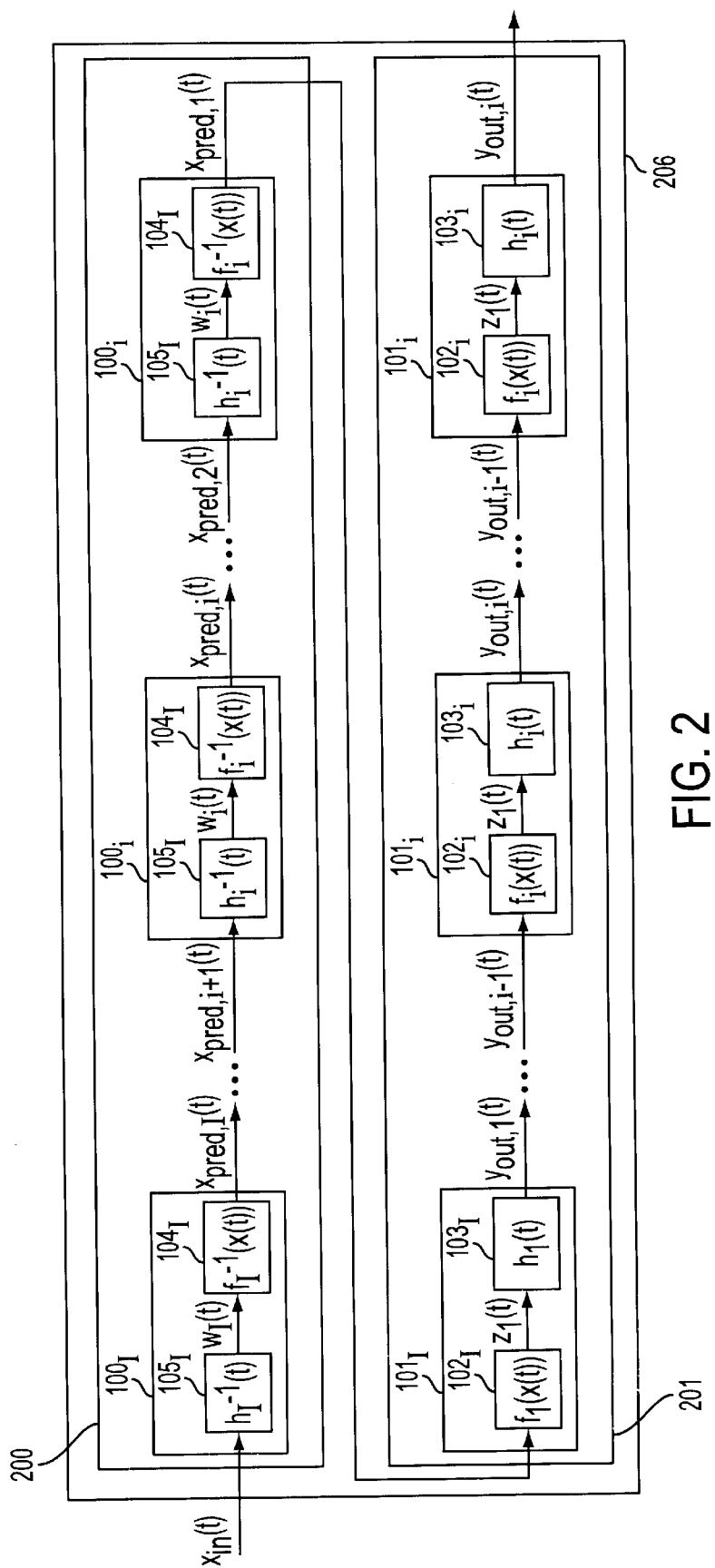
Figure 3:
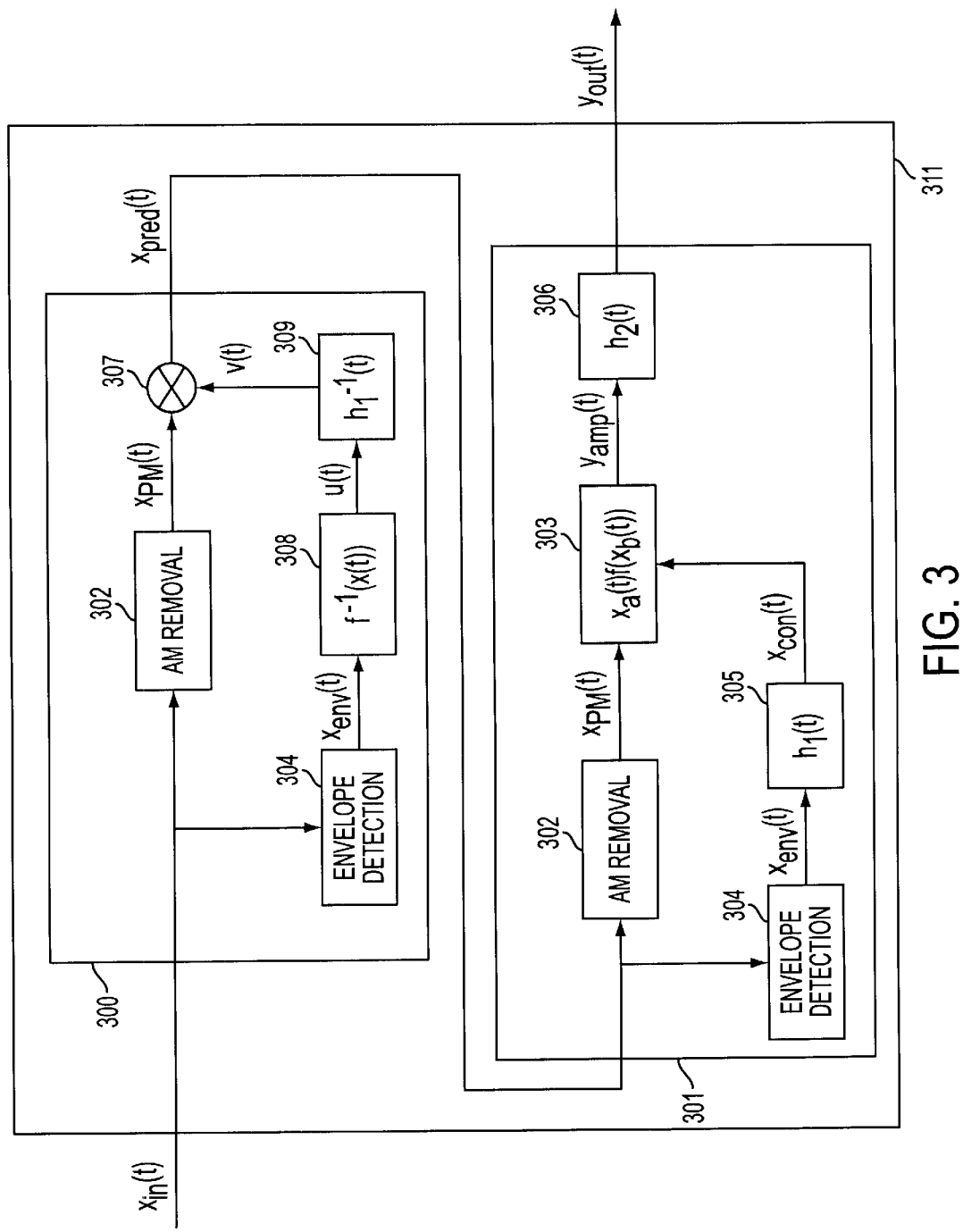

The invention disclosed herein provides a novel method for deriving pre-distorters for a broad class of non-linear amplifiers. To illustrate the method, three specific examples are provided. Referring to FIGS. 1 to 3, in these examples, pre-distorters 100, 200, and 300 are derived for respectively a simple non-linear amplifier 101, a multi-cascaded non-linear amplifier 201, and an EER (i.e., envelope elimination and restoration) non-linear amplifier 301.

Pre-Distorter 100 for Simple Non-linear Amplifier 101

Figure 4:
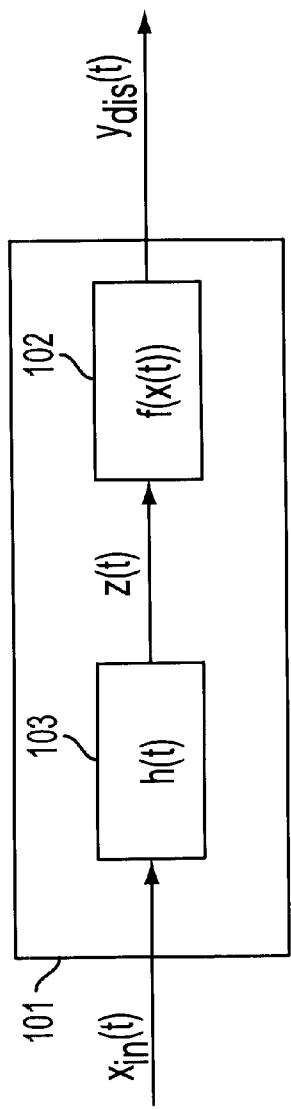
FIG. 4 shows a block diagram of the configuration of the amplifier of FIG. 1.

FIG. 4 shows the topology of the simple non-linear amplifier 101. The amplifier 101 comprises a non-linear amplifier element 102 without memory and a linear filter element 103 with memory. The amplifier element 102 and the linear filter element 103 are cascaded (i.e., connected in series).

The amplifier element 102 has a characteristic non-linear response f(x(t)) to an input signal x(t). Thus, it is clear that the output signal z(t) of the amplifier element 102 in response to an input signal $x_{in}(t)$ is given by:

$$z(t)=f(x_{in}(t)) \quad (1)$$

where $x_{in}(t)=x(t)$.

The filter element 103 has a characteristic linear response $h(t)$. This means that the output signal $y_{dis}(t)$ of the filter element 103 (and also the amplifier 101) can be expressed as:

$$y_{dis}(t)=h(t)*f(x_{in}(t)) \quad (2)$$

The output signal $y_{dis}(t)$ may be distorted by the non-linearity of the amplifier element 102 and/or the bandlimiting effect of the filter element 103.

Derivation of Pre-Distorter 100

Figure 5:
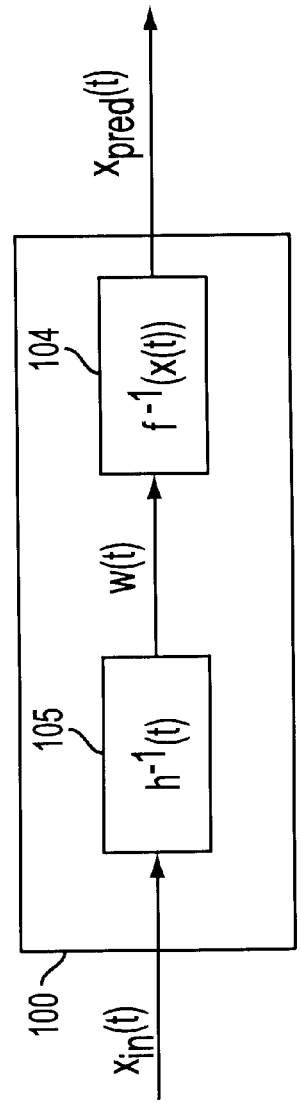
FIG. 5 shows a block diagram of the configuration of the pre-distorter of FIG. 1.

The first step in deriving the corresponding pre-distorter 100 in FIG. 5 to the amplifier 101 in FIG. 4 is to define the topology of the pre-distorter 100. This is done by first determining the inverse topology to that of the amplifier 101. This inverse topology comprises a corresponding inverse amplifier element 104 to the amplifier element 102 and a corresponding inverse filter element 105 to the filter element 103.

Then, each of the amplifier and filter elements 102 and 103 of the amplifier 101 of FIG. 4 for which compensation is desired are identified. Each inverse element 104 or 105 corresponding to an element 102 or 103 for which compensation is not desired is then removed to form the topology of the pre-distorter 100.

In the example provided here, the amplifier element 104 is assumed to have a significant non-linear behavior at the carrier frequency of the input and output signals $x_{in}(t)$ and $y_{dis}(t)$ and the filter element 103 is assumed to be a bandpass filter with a significant bandlimiting effect at the carrier frequency. In this case, the distorted output signal $y_{dis}(t)$ is significantly distorted at the carrier frequency by the non-linear behavior of the amplifier element 102 and the bandlimiting effect of the filter element 103. As a result, compensation is desired for both the amplifier and filter elements 102 and 103. As shown in FIG. 5, both the inverse amplifier and filter elements 104 and 105 are therefore used in the topology for the pre-distorter 100.

Still referring to FIG. 5, to compensate for the response $h(t)$ of the filter element 103, the corresponding inverse filter element 105 has a characteristic response $h^{-1}(t)$. The output signal $w(t)$ of the filter element 105 in response to an input signal $x_{in}(t)$ is therefore given by:

$$w(t)=h^{-1}(t)*x_{in}(t) \quad (3)$$

The inverse amplifier element 104 has a characteristic response $f^{-1}(x(t))$ to an input signal $(x(t))$. This is used to compensate for the response $f(x(t))$ of the corresponding amplifier element 102. In view of Eq. (3), the pre-distorted output signal $x_{pred}(t)$ of the inverse filter element 105 (and also the pre-distorter 100) in response to the output signal $w(t)$ of the filter element 105 is given by:

$$x_{pred}(t)=f^{-1}(w(t))=f^{-1}(h^{-1}(t)*x_{in}(t)) \quad (4)$$

where $w(t)=x(t)$.

The next step in deriving the pre-distorter 100 is to define the responses $f^{-1}(x(t))$ and $h^{-1}(t)$ for the inverse amplifier and filter elements 104 and 105 of FIG. 5. In order to do so, it is necessary to develop a model of the behavior of the corresponding amplifier and filter elements 102 and 103 of FIG. 4. This may be done in the following manner.

The behavior of the amplifier element 102 can be modeled (i.e., approximated) by the series expansion:

$$f(x_{in}(t)) \approx \sum_{n=0}^{N} b_n x_{in}(t)^n \quad (5)$$

where the set of coefficients $\{b_0, \ldots, b_N\}$ defines the response $f(x(t))$ of the amplifier element 102. Assuming that the inverse response $f^{-1}(f(x_{in}(t))/g)$ to the response $f(x_{in}(t))$ exists and is bounded by an input signal $f(x_{in}(t))/g$, the behavior of the amplifier element 102 can also be modeled in an inverted manner with the following series expansion:

$$x_{in}(t) = f^{-1}(f(x_{in}(t))) \approx \sum_{p=0}^{P} d_p \left( \frac{f(x_{in}(t))}{g} \right)^p \quad (6)$$

where P is the selected order of the pre-distorter 100 and the set of coefficients $\{d_0, \ldots, d_P\}$ defines the response $f^{-1}(x(t))$ of the inverse amplifier element 104 of FIG. 5. The gain g is the desired gain of the amplifier element 102 of FIG. 4. It appears in Eq. (6) so that the coefficients $\{d_0, \ldots, d_P\}$ of the response $f^{-1}(x(t))$ are properly defined not to cause amplification of the pre-distorted output signal $x_{pred}(t)$ by the gain g.

If the filter element 103 is assumed to be minimum phase, its behavior can be modeled by an AR (i.e., auto regressive) filter. Thus, the corresponding Z transform $H(z)$ for the response $h(t)$ can be modeled by the series expansion:

$$H(z) \approx \frac{1}{\sum_{m=0}^{M} a_m z^{-m}} \quad (7)$$

where $a_0=1$ and the set of coefficients $\{a_0, \ldots, a_M\}$ defines the response $h(t)$. Furthermore, the fact that the filter element 103 is assumed to be minimum phase means that the inverse response $h^{-1}(t)$ to the response $h(t)$ exists. Thus, this response $h^{-1}(t)$ of the inverse filter element 105 of the pre-distorter 100 of FIG. 5 is also defined by the coefficients $\{a_0, \ldots, a_M\}$ since its Z transform $H^{-1}(z)$ can be modeled by the series expansion:

$$H(z)^{-1} = \sum_{m=0}^{M} a_m z^{-m} \quad (8)$$

As just mentioned, the response $h^{-1}(t)$ does exists. Thus, Eq. (2) can be re-written as follows:

$$y_{dis}(t)*h^{-1}(t)=f(x_{in}(t)) \quad (9)$$

In view of Eqs. (5) and (8), Eq. (9) can be re-written to model the combined behavior of the amplifier and filter elements 102 and 103 of the amplifier 101 of FIG. 4 in the following manner:

$$y_{dis}(t) \approx \sum_{n=0}^{N} b_n x_{in}(t)^n - \sum_{m=1}^{M} a_m y_{dis}(t-mT) \quad (10)$$

where $1/T$ represents a sampling rate.

Using the assumption that the filter element 103 is minimum phase, the model of the amplifier 101 represented by Eqs. (6) and (10) is linear in its parameters. Thus, it can be easily and efficiently estimated using an LMS (i.e., least mean squares) estimation.

In performing this LMS estimation, an input matrix $X_1$ and an output vector Y must first be defined as follows:

$$X_1 = \begin{bmatrix} x_{in}(t)^0 & x_{in}(t)^1 & \cdots & x_{in}(t)^N & y_{dis}(t-T) & \cdots & y_{dis}(t-MT) \\ x_{in}(t+T)^0 & x_{in}(t+T)^1 & \cdots & x_{in}(t+T)^N & y_{dis}(t-T+T) & \cdots & y_{dis}(t-MT+T) \\ x_{in}(t+2T)^0 & x_{in}(t+2T)^1 & \cdots & x_{in}(t+2T)^N & y_{dis}(t-T+2T) & \cdots & y_{dis}(t-MT+2T) \\ \vdots & \vdots & \ddots & \vdots & \vdots & \ddots & \vdots \end{bmatrix} \quad (11)$$

$$Y = \begin{bmatrix} y_{dis}(t) \\ y_{dis}(t+T) \\ y_{dis}(t+2T) \\ \vdots \end{bmatrix} \quad (12)$$

As will be discussed later in more detail, the elements of the matrix $X_1$ and the vector Y are obtained by applying an input signal $x_{in}(t)$ to the amplifier 101. This input signal $x_{in}(t)$ should be the same type of input signal (i.e., have the same bandwidth and amplitude distribution) that will be applied to the amplifier system 106 of FIG. 1 during actual operating conditions. This will ensure that the responses $f^{-1}(x(t))$ and $h^{-1}(t)$ for the inverse amplifier and filter elements 104 and 105 of FIG. 5 are specifically defined for this type of input signal. Measurements of the input signal $x_{in}(t)$ and the output signal $y_{dis}(t)$ are then made from which the elements of the matrix $X_1$ and vector Y are obtained. These measurements are made at the sampling rate 1/T mentioned earlier.

Based on Eq. (10) of the model, the input matrix $X_1$ and the output vector Y are related to the coefficient vector $[b_0 \ldots b_N - a_1 \ldots -a_M]^T$ by the following expression:

$$Y = X_1 \begin{bmatrix} b_0 \\ \vdots \\ b_N \\ -a_1 \\ \vdots \\ -a_M \end{bmatrix} \quad (13)$$

In order to obtain the coefficient vector $[b_0 \ldots b_N - a_1 \ldots -a_M]^T$ the LMS solution for Eq. (13) can be easily computed according to:

$$\begin{bmatrix} b_0 \\ \vdots \\ b_N \\ -a_1 \\ \vdots \\ -a_M \end{bmatrix} = (X_1^H X_1)^{-1} X_1^H Y \quad (14)$$

where the matrix $X_1^H$ is the Hermitian transpose of the matrix $X_1$.

$$H(z) \approx \sum_{m=0}^{M} a_m z^{-m} \quad (15)$$

In this manner, the sets of coefficients $\{b_0, \ldots, b_N\}$ and $\{a_0, \ldots, a_M\}$ are estimated for properly defining the responses $f(x(t))$ and $h(t)$ of the amplifier and filter elements 102 and 103 of the amplifier of FIG. 4. The response $h^{-1}(t)$ for the inverse filter element 105 of the pre-distorter 100 of FIG. 5 is therefore also defined by the 5 coefficients $\{a_0, \ldots, a_M\}$.

However, in order to define the response $f^{-1}(x(t))$ of the inverse filter element 104 of FIG. 5, an additional LMS estimation must be made. In performing this additional LMS estimation, the output signal z(t) of the amplifier element 104 of the amplifier 101 of FIG. 4 must be estimated in response to the input signal $x_{in}(t)$. This is done by defining the corresponding output vector $Z_1$:

$$Z_1 = \begin{bmatrix} z(t) \\ z(t+T) \\ z(t+2T) \\ \vdots \end{bmatrix}$$

and then computing it according to:

$$Z_1 = X_1 \begin{bmatrix} b_0 \\ \vdots \\ b_N \\ 0 \\ \vdots \\ 0 \end{bmatrix} \quad (17)$$

An output matrix $Z_2$ and an input vector $X_2$ can then be defined as follows for this LMS estimation:

$$Z_2 = \begin{bmatrix} z(t)^0/g^0 & z(t)^1/g^1 & \cdots & z(t)^P/g^P \\ z(t+T)^0/g^0 & z(t+T)^1/g^1 & \cdots & z(t+T)^P/g^P \\ z(t+2T)^0/g^0 & z(t+2T)^1/g^1 & \cdots & z(t+2T)^P/g^P \\ \vdots & \vdots & \ddots & \vdots \end{bmatrix} \quad (18)$$

$$X_2 = \begin{bmatrix} x_{in}(t) \\ x_{in}(t+T) \\ x_{in}(t+2T) \\ \vdots \end{bmatrix} \quad (19)$$

The elements for the matrix $Z_2$ and the vector $X_2$ are obtained from the elements of the vector $Z_1$ and the matrix $X_1$, respectively.

Based on Eq. (6) of the model, the output matrix $Z_2$ and the input vector $X_2$ are related to a coefficient vector $[d_0 \ldots d_P]^T$ according to the following expression:

$$X_2 = Z_2 \begin{bmatrix} d_0 \\ \vdots \\ d_P \end{bmatrix} \quad (20)$$

In order to obtain the coefficient vector $[d_0 \ldots d_P]^T$, the LMS solution for Eq. (20) can be computed using matrix inversion according to:

$$\begin{bmatrix} d_0 \\ \vdots \\ d_P \end{bmatrix} = (Z_2^H Z_2)^{-1} Z_2^H X_2 \qquad (21)$$

where $Z_2$ is the Hermitian transpose of $Z_2$. Therefore, in this approach, the set of coefficients $\{d_0, \ldots, d_P\}$ are directly estimated.

In this manner, the set of coefficients $\{d_0, \ldots, d_P\}$ is estimated for properly defining the response $f^{-1}(x(t))$ of the inverse amplifier element 105. Since the response $h^{-1}(t)$ of the inverse filter element 104 was previously defined with the estimated set of coefficients $\{a_0, \ldots, a_M\}$, the behavior of the inverse amplifier and filter elements 104 and 105 of the pre-distorter 100 can now be properly modeled by two cascaded processes. The first process is performed by the inverse filter element 105 and can be expressed as follows:

$$w(t) \approx [x_{in}(t-T) \; x_{in}(t-2T) \; \cdots \; x_{in}(t-MT)] \begin{bmatrix} -a_1 \\ -a_2 \\ \vdots \\ -a_M \end{bmatrix} \qquad (22)$$

The second process is performed by the inverse amplifier element 104 and can be expressed in the following manner:

$$x_{pred}(t) \approx [w(t)^0 \; w(t)^1 \; \cdots \; w(t)^P] \begin{bmatrix} d_0 \\ d_1 \\ \vdots \\ d_P \end{bmatrix} \qquad (23)$$

Since these processes only involve simple additions and multiplications, the implementation of the pre-distorter 100 with the inverse filter and amplifier elements 104 and 105 is also simple and efficient.

Amplifier System 106 and Operation

FIG. 1 shows an amplifier system 106 that comprises the amplifier 101 and the corresponding pre-distorter 100 that was just derived. The pre-distorter 100 pre-distorts the original input signal $x_{in}(t)$ according to Eqs. (21) and (22) to produce the pre-distorted input signal $x_{pred}(t)$. The pre-distorted input signal $x_{pred}(t)$ is then amplified by the amplifier 101 to produce the undistorted output signal $y_{out}(t)$. The output signal $y_{out}(t)$ is not distorted by the non-linear behavior of the amplifier element 102 and the bandlimiting effect of the filter element 103 that were compensated for with the pre-distorter 100.

Performance Evaluation of Pre-Distorter 100

The method just described for deriving the pre-distorter 100 was verified with simulations using two different characteristic responses $f_1(x(t))$ and $f_2(x(t))$ for the response $f(x(t))$ of the non-linear amplifier element 102 of the amplifier 101 of FIG. 4.

These responses $f_1(x(t))$ and $f_2(x(t))$ are given by:

$$f_1(x(t)) = x(t) + \frac{x(t)^5}{10} \qquad (24)$$

$$f_2(x(t)) = \frac{2x(t)}{1+x(t)^2} e^{\frac{i\pi x(t)}{3(1+x(t)^2)}} \qquad (25)$$

The first response $f_1(x(t))$ models an arbitrary amplifier. The second response $f_2(x(t))$ models a traveling wave tube. This response is complex valued and models the AM to FM (i.e., amplitude modulation to frequency modulation) conversion that takes place in the amplifier element 102.

For both output responses $f_1(x(t))$ and $f_2(x(t))$ used for the amplifier element 102, the same characteristic response $h(t)$ was used for the filter element 103 of the amplifier 101. The Z transform $H(z)$ for this response $h(t)$ is expressed by:

$$H(z) = \frac{1}{1 + (-1.7798 + 0.1176i)z^{-1} +} \qquad (26)$$
$$(1.3885 - 0.1046i)z^{-2} +$$
$$(-0.5340 + 0.0353i)z^{-3} + 0.090z^{-4}$$

The response $h(t)$ is complex valued and is used as the baseband equivalent of an RF filter. It causes significant distortion in the output signal $y_{dis}(t)$.

In the simulations, two input signals $x_1(t)$ and $x_2(t)$ were used as the input signal $x_{in}(t)$. The first input signal $x_1(t)$ comprised two independent bandlimited white Gaussian noise components. One component was used as the I component (i.e., the real component) of the signal $x_1(t)$ and the other component was used as the Q component (i.e., complex component) of the signal $x_1(t)$. The second input signal $x_2(t)$ comprised a normalized two-tone single-sideband signal. The fact that the response $f_2(x(t))$ is not invertible for all inputs does not cause any problems in the estimation process due to the way in which the estimations are made. However, both signals $x_1(t)$ and $x_2(t)$ were normalized to have unity amplitude since the response $f_2(x(t))$ is only invertible in the range 0 to 1.

For each of the four combinations of responses $f_1(x)$ and $f_2(x)$ and input signals $x_1(t)$ and $x_2(t)$, a corresponding simulation of the amplifier 100 was performed. Each of these simulations also used the response $h(t)$ just described. For each simulation, measurements of the input signal $x_1(t)$ or $x_2(t)$ and the corresponding distorted output signal $y_{dis}(t)$ were made for obtaining the elements of the matrices and vectors $X_1$, $Y$, $Z_1$, $Z_2$, and $X_2$. Then, for each simulation, pre-distorters 100 with orders P=3, 5, 7, 9, and 11 were derived in the manner described earlier.

Figure 6:
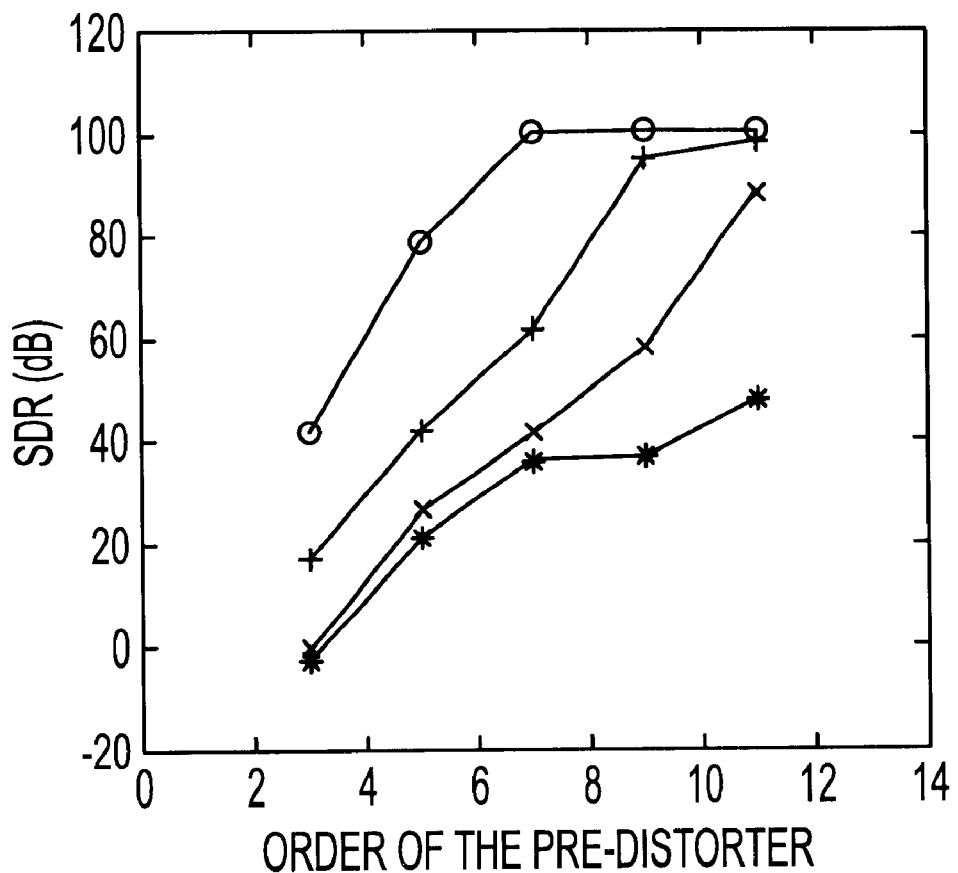
FIG. 6 shows the performance of the pre-distorter of FIG. 5.

To determine the performance of the pre-distorters 100 derived for each simulation, an SDR (signal to distortion ratio) was used. The SDR can be defined as:

$$SDR = -10\log 10 \left( \frac{E(y_{dis}(t) - gx_{in}(t))^2}{E(gx_{in}(t))^2} \right) \qquad (27)$$

$$E(x(t))^2 = \int_0^\infty x(t)^2 dt \qquad (28)$$

where $E(x(t))^2$ is simply the energy of a signal $x(t)$ and is given by:

FIG. 6 shows the performances. For each simulation, the improvement in SDR when going from a pre-distorter 100 of order P=3 to order P=11 is a minimum of 50 dB. This demonstrates that much improved pre-distorters 100 can be achieved when increasing the order P.

Alternative Estimation Techniques

The set of coefficients $\{d_0, \ldots, d_P\}$ were directly estimated using Eq. (21) in the example provided earlier.

However, the set of coefficients $\{d_0, \ldots, d_P\}$ can be indirectly estimated as well using a similar approach for the LMS estimation. In this approach, an output matrix $Z_3$ can be defined as follows:

$$Z_3 = \begin{bmatrix} z(t)^0 & z(t)^{1} & \cdots & z(t)^P \\ z(t+T)^0 & z(t+T)^1 & \cdots & z(t+T)^P \\ z(t+2T)^0 & z(t+2T)^1 & \cdots & z(t+2T)^P \\ \vdots & \vdots & \ddots & \vdots \end{bmatrix} \quad (29)$$

where the elements of the matrix $Z_2$ are not adjusted for the gain g. As with the elements of the matrix $Z_2$, the elements of the matrix $Z_3$ are obtained from the elements of the vector $Z_1$.

The output matrix $Z_3$ and the input vector $X_2$ are related to a coefficient vector $[c_0 \ldots c_P]^T$ as follows:

$$X_2 = Z_3 \begin{bmatrix} c_0 \\ \vdots \\ c_P \end{bmatrix} \quad (30)$$

The LMS solution for Eq. (30) is then computed according to:

$$\begin{bmatrix} c_0 \\ \vdots \\ c_P \end{bmatrix} = (Z_3^H Z_3)^{-1} Z_3^H X_2 \quad (31)$$

where $Z_3^H$ is the Hermitian transpose of $Z_3$. After the coefficient vector $[c_0 \ldots c_P]^T$ is obtained from the LMS solution, the coefficient vector $[d_0 \ldots d_P]^T$ is obtained according to:

$$\begin{bmatrix} d_0 \\ d_1 \\ \vdots \\ d_P \end{bmatrix} = \begin{bmatrix} c_0/g^0 \\ c_1/g^1 \\ \vdots \\ c_P/g^P \end{bmatrix} \quad (32)$$

where $d_j = c_j/g^j$. In this way, the set of coefficients $\{d_0, \ldots, d_P\}$ are indirectly estimated.

Furthermore, in the LMS estimations discussed earlier for obtaining the coefficient vectors $[b_0 \ldots b_N - a_1 \ldots -a_M]^T$, $[d_0 \ldots d_P]^T$, and $[c_0 \ldots c_P]^T$, matrix inversions were used to solve Eqs. (14), (20), and (30). But, these matrix inversions can be avoided by iteratively finding these coefficient vectors $[b_0 \ldots b_N - a_1 \ldots -a_M]^T$, $[d_0 \ldots d_P]^T$, and $[c_0 \ldots c_P]^T$, using RLS (i.e., recursive least squares) estimations or GAL (i.e., gradient adaptive lattice) estimations in the manner described in Haykin, Simon, *Adaptive Filter Theory*, 2nd. Ed. Prentice Hall, Englewood Cliffs, N.J., 1991, which is hereby incorporated by reference. Furthermore, SVDs (i.e., singular value decomposition) of the matrices $X_1^H X_1$, $Z_2^H Z_2$, and $Z_3^H Z_3$ in Eqs. (14), (20), and (30) can be used. This becomes useful when the matrices $X_1^H X_1$, $Z_2^H Z_2$, and $Z_3^H Z$ are close to singular. In practice, this will happen sooner or later as the selected order P of the model of the amplifier 101 (and the derived pre-distorter) increases. But, generally this is an indication that the order P is too high.

Alternative Configurations for Pre-distorter 100

In the earlier example, compensation was desired for both the amplifier and filter elements 103 and 104. Therefore, the corresponding inverse amplifier and filer elements 104 and 105 were utilized in the topology of the pre-distorter 100.

However, as those skilled in the art will recognize, it may be desired to compensate for only the amplifier element 103 or only the filter element 104. For example, if only the non-linear behavior of the amplifier element 103 or only the bandlimiting effect of the filter element 104 causes significant distortion in the output signal $y_{dis}(t)$ at the carrier frequency, then only the corresponding inverse amplifier element 104 or inverse filer element 105 would be used in the topology of the pre-distorter 100. The corresponding responses $f^{-1}((x(t))$ or $h^{-1}(t)$ would still be derived in the same manner as described previously. But, only the distortion of the amplifier or filter element 102 or 103 that was compensated for with the pre-distorter 100 would not distort the output signal $y_{out}(t)$.

Pre-distorter for Multi-Cascaded Non-Linear Amplifier

Figure 7:
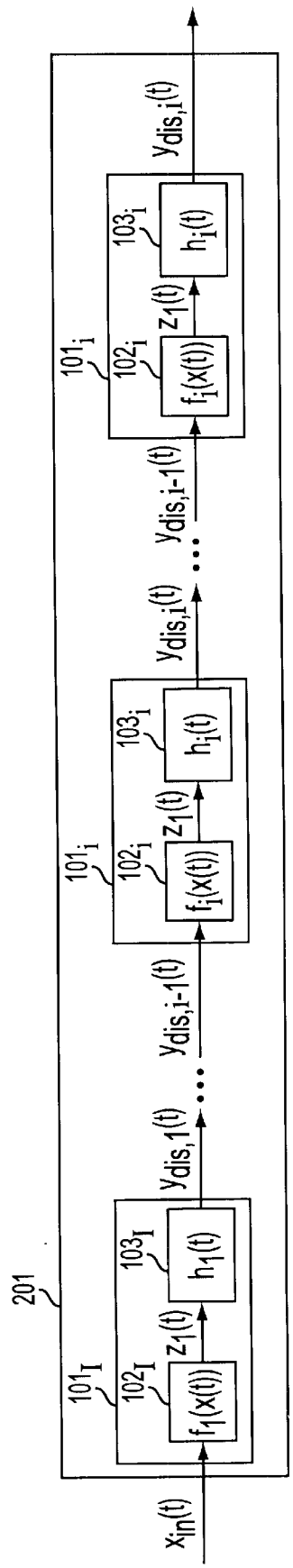
FIG. 7 shows a block diagram of the configuration of the amplifier of FIG. 2.

Referring to FIG. 7, the method just described for deriving the pre-distorter 100 of FIGS. 1 and 5 can be applied to a multi-cascaded non-linear amplifier 201 with cascaded non-linear sub-amplifiers $101_1$ to $101_I$, where the index i=1 to I. Each sub-amplifier $101_i$ is configured and operates like the amplifier 101 of FIGS. 1 and 4 because it comprises a corresponding non-linear amplifier element $102_i$ without memory and a corresponding linear filter element $103_i$ with memory.

Derivation of Pre-Distorter 200

Figure 8:
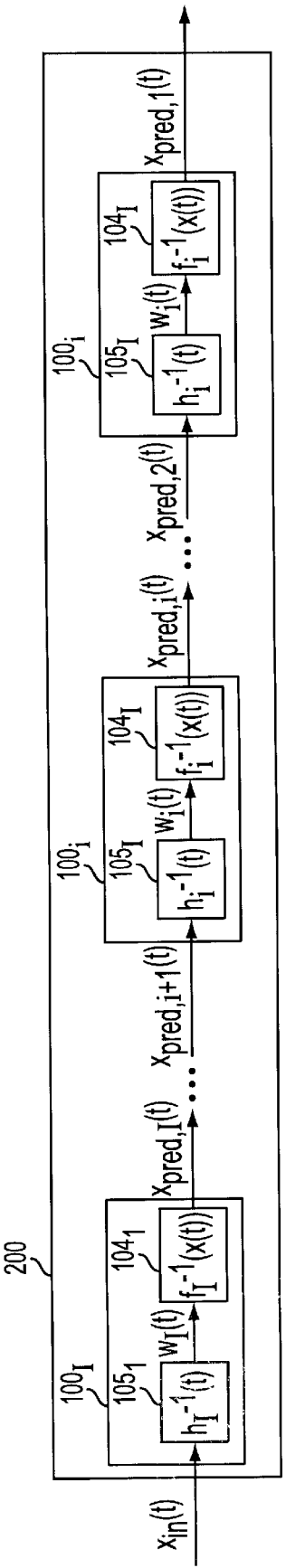
FIG. 8 shows a block diagram of the configuration of the pre-distorter of FIG. 2.

Like the derivation of the pre-distorter 100, the first step in deriving the pre-distorter 200 in FIG. 8 is to define its topology. The topology of the pre-distorter 200 is formed by first determining the inverse topology to that of the amplifier 201. As a result, the inverse topology comprises cascaded sub-pre-distorters $100_I$ to $100_1$, where there is a corresponding sub-pre-distorter $100_i$ for each sub-amplifier $101_i$. Each sub-pre-distorter $100_i$ is configured, derived, and operates like the pre-distorter 100 of FIGS. 1 and 5 because it comprises a corresponding inverse amplifier element $104_i$ to the amplifier element $102_i$ and a corresponding inverse filter element $105_i$ to the filter element $103_i$.

To further define the topology of the pre-distorter 200, each element 103$i$ and 104$i$ of a sub-amplifier 101$i$ for which compensation is desired is identified. Then, any inverse element $104_i$ or $105_i$ corresponding to an element $103_i$ or $104_i$ of a sub-amplifier $101_i$ for which compensation is not desired is removed from the inverse topology. This includes removing a sub-amplifier $101_i$ entirely if compensation is not desired for either of its inverse amplifier and filter elements $104_i$ and $105_i$.

In the example provided here, compensation is desired for both the amplifier and filter elements $102_i$ and $103_i$ of each sub-amplifier $101_i$ for the same reasons as those expressed earlier for the amplifier and filter elements 102 and 103 of the amplifier 101 of FIG. 4. Thus, as shown in FIG. 8, both the inverse amplifier and filter elements $104_i$ and $105_i$ are used in the topology for the corresponding sub-pre-distorter $100_i$.

The next step is to define the responses $f^{31\ 1}_i(x(t))$ and $h^{-1}_i(t)$ for the inverse amplifier and filter elements $104_i$ and $105_i$ of each sub-distorter $100_i$ of FIG. 8. Referring to FIG. 7, this is done by applying an input signal $x_{in}(t)$ to the first sub-amplifier $101_1$ of the amplifier 201. Here as well, the input signal $x_{in}(t)$ should be the same type of input signal that will be applied to the amplifier system 206 of FIG. 2 during actual operating conditions. This will ensure that the responses $f^{-1}_i(x(t))$ and $h^{-1}_i(t)$ for the inverse amplifier and filter elements $104_i$ and $105_i$ of each sub-distorter $100_i$ are specifically defined for this type of input signal.

For each sub-amplifier $101_i$ except for the first sub-amplifier $101_1$, the corresponding input signal is the output signal $y_{dis,i-1}(t)$ of the previous sub-amplifier $101_{i-1}$. For each sub-amplifier $101_i$, measurements of the corresponding input signal $x_{in}(t)$ or $y_{dis,i-1}(t)$ and the corresponding output signal $y_{dis,i}(t)$ of the sub-amplifier $101_i$ are then made. Based on these measurements, the responses $f^{-1}_i(x(t))$ and $h^{-1}_i(t)$ for the inverse amplifier and filter elements $104_i$ and $105_i$ of the sub-amplifier $101_i$ are defined. This is done in the same manner in which the responses $f^{-1}(x(t))$ and $h^{-1}(t)$ for the inverse amplifier and filter elements 104 and 105 of the pre-distorter 100 of FIG. 5 were defined except for a few minor differences discussed next.

For each sub-amplifier $101_i$, the terms $z(t)$ and $y_{dis}(t)$ are replaced by the terms $z_i(t)$ and $y_{dis,i}(t)$ to properly identify the corresponding output signal $z_i(t)$ and the corresponding distorted output signal $y_{dis,i}(t)$ of the amplifier and filter elements $102_i$ and $103_i$, respectively, of the sub-amplifier $101_i$. Similarly, the terms $f(x(t))$ and $h(t)$ are replaced by the terms $f_i(x_i(t))$ and $h_i(t)$ to properly identify the characteristic responses $f_i(x_i(t))$ and $h_i(t)$ of the amplifier and filter elements $102_i$ and $103_i$. In addition, for each sub-amplifier $101_i$ except for the first sub-amplifier $101_1$, the term $x_{in}(t)$ is replaced by the term $y_{dis,i-1}(t)$ to properly identify the corresponding input signal $y_{dis,i-1}(t)$ to the amplifier element $102_i$ of the sub-amplifier $101_i$.

Furthermore, for each pre-distorter $100_i$, the terms $w(t)$ and $x_{pred}(t)$ are replaced by the terms $w_i(t)$ and $x_{pred,i}(t)$ to properly identify the corresponding internal signal $w_i(t)$ and the corresponding output signal $x_{pred,i}(t)$ of the inverse filter and amplifier elements $105_i$ and $104_i$, respectively, of the sub-pre-distorter $100_i$. Also, the terms $f(x^{-1}(t))$ and $h^{-1}(t)$ are replaced by the terms $f(x_i^{-1}(t))$ and $h_i^{-1}(t)$ to properly identify the characteristic responses $f(x_i^{-1}(t))$ and $h_i^{-1}(t)$ of the inverse amplifier and filter elements $104_i$ and $105_i$. Finally, for each sub-pre-distorter $100_i$ except for the first sub-pre-distorter $100_I$, the term $x_{in}(t)$ is replaced by the term $x_{pred,i+1}(t)$ to properly identify the corresponding input signal $x_{pred,i-1}(t)$ to the inverse filter element $105_i$ of the sub-pre-distorter $100_i$.

The sub-pre-distorters $100_I$ to $100_1$ are then cascaded in opposite order to that of the sub-amplifiers $101_1$ to $100_I$ to form the pre-distorter 200. For each sub-pre-distorter $100_i$ except the final sub-pre-distorter $100_I$, the output signal $x_{pred,i}(t)$ is the input signal $x_{in,i-1}(t)$ to the next sub-pre-distorter $100_{i-1}$. The final output signal $x_{pred,1}(t)$ from the final sub-pre-distorter $100_1$ is the pre-distorted input signal to be provided to the amplifier 201.

Amplifier System 206 Topology and Operation

FIG. 2 shows an amplifier system 206 that comprises the amplifier 201 and the corresponding pre-distorter 200. An original input signal $x_{in}(t)$ is applied to the pre-distorter 200 and pre-distorted by the pre-distorter 200 to produce the pre-distorted input signal $x_{pred,1}(t)$ provided to the amplifier 201. In doing so, each sub-pre-distorter $100_i$ pre-distorts the corresponding input signal $x_{in}(t)$ or $x_{pred,i+1}(t)$ to produce the corresponding output signal $x_{pred,1}(t)$ according to Eqs. (21) and (22), but where $x_{pred,i+1}(t)=x_{in}(t)$ for i<I, $w_i(t)=w(t)$, and $x_{pred,i}(t)=x_{pred}(t)$. The final output signal $x_{pred,1}(t)$ from the final sub-pre-distorter $100_1$ is the pre-distorted input signal provided to the amplifier 201.

The pre-distorted input signal $x_{pred,1}(t)$ is then amplified by the amplifier 101 to produce the undistorted output signal $y_{out,1}(t)$. In this process, the corresponding input signal for the first sub-amplifier $101_1$ is the pre-distorted input signal $x_{pred,1}(t)$ while the corresponding input signal for every other sub-amplifier $101_i$ is the distorted output signal $y_{out,i-1}(t)$ of the previous sub-amplifier $101_{i-1}$. Each sub-amplifier $101_i$ amplifies the corresponding input signal $x_{pred,1}(t)$ or $y_{out,i-1}(t)$ to produce the corresponding output signal $y_{out,i}(t)$ The final output signal $y_{out,I}(t)$ from the final sub-amplifier $100_I$ is the undistorted output signal $y_{out,I}(t)$ This output signal $y_{out,I}(t)$ is not distorted by the non-linear behavior of any amplifier element $102_i$ and the bandlimiting effect of any filter element $103_i$ that were compensated for with the pre-distorter 200.

Performance Evaluation and Alternative Configurations and Estimation Techniques As mentioned earlier, each sub-pre-distorter $100_i$ is configured, derived, and operates like the pre-distorter 100 of FIGS. 1 and 5. Thus, the performance evaluation and alternative configurations and estimations discussed earlier for the pre-distorter 100 apply to each sub-pre-distorter $100_i$.

Pre-distorter for EER Non-Linear Amplifier

Figure 9:
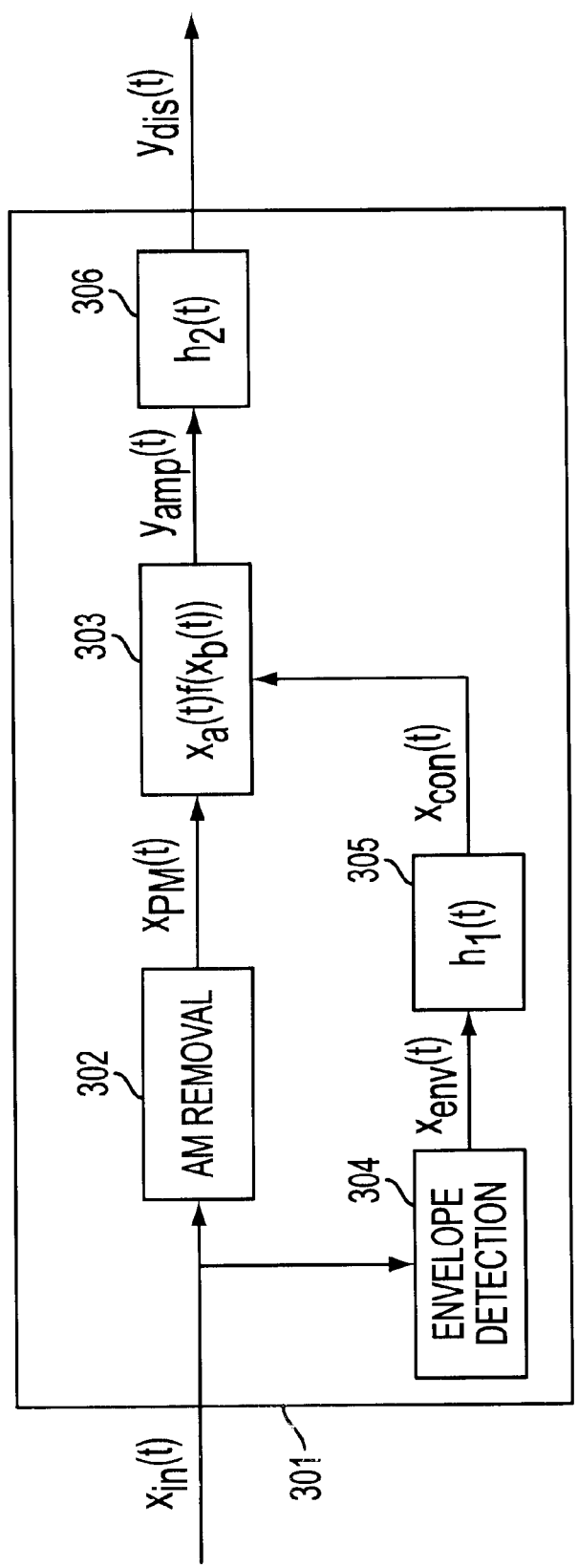
FIG. 9 shows a block diagram of the configuration of the amplifier of FIG. 3.

FIG. 9 shows the topology of the EER non-linear amplifier 301. The amplifier 301 comprises an AM removal element (e.g., a hard limiter) 302, a non-linear amplifier element 303 without memory, an envelope detection element 304, a first filter element 305 with memory, and a second filter element 306 with memory. The AM removal element 302, the amplifier element 303, and the second filter element 306 are cascaded to form a main path of the amplifier 301. The envelope detection element 304 and the first filter element 305 are cascaded to form a control path of the amplifier 301. In the control path, the first filter element 305 is connected to the amplifier element 303 for controlling the amplification by the amplifier element 303 in the main path.

The AM removal element 302 and the envelope detection element 304 both receive an input signal $x_{in}(t)$ and split it into a PM (pulse modulation) signal $x_{PM}(t)$ and an envelope signal $x_{env}(t)$. The envelope signal $x_{env}(t)$ is bandlimited by the first filter element 305 to produce a control signal $x_{con}(t)$ for controlling the amplification by the amplifier element 303. The filter element 305 has a characteristic response $h_1(t)$ such that the control signal $x_{con}(t)$ is given by:

$$x_{con}(t)=h_1(t)*x_{env}(t) \qquad (33)$$

The PM signal $x_{PM}(t)$ is amplified by the amplifier element 303 in response to the control signal $x_{con}(t)$ to produce the amplified signal $y_{amp}(t)$. The amplifier element 303 has a characteristic complete response $x_a(t)f(x_b(t))$ to a first input signal $x_a(t)$ and a second input signal $x_b(t)$ that controls amplification of the first input signal $x_a(t)$. The amplified signal $y_{amp}(t)$ in response to the PM signal $x_{PM}(t)$ and the control signal $x_{con}(t)$ is given by:

$$y_{amp}(t)=x_{PM}(t)f(x_{con}(t)) \qquad (34)$$

where $x_{PM}(t)=x_a(t)$ and $x_{con}(t)=x_b(t)$.

The complete response $x_a(t)f(x_b(t))$ of the amplifier element 303 includes the characteristic non-linear partial response f($x_b$(t)). In view of the partial response f($x_b$(t)), the envelope signal $y_{env}$(y) for the amplified signal $y_{amp}$(t) is given by:

$$y_{env}(t) = f(x_{con}(t)) \quad (35)$$

The amplified signal $y_{amp}$(t) and the envelope signal $y_{env}$(y) may be distorted by the non-linear behavior of the amplifier element 303 and/or the bandlimiting effect of the filter element 305. The amplified signal $y_{amp}$(t) is then bandlimited by the second filter element 306 to produce an output signal $y_{dis}$(t) of the amplifier 301. The filter element 306 has a characteristic response $h_2$(t). Thus, the output signal $y_{dis}$(t) can be expressed by:

$$y_{dis}(t) = h_2(t) * y_{amp}(t) \quad (36)$$

Because the output signal $y_{dis}$(t) is based on the amplified signal $y_{amp}$(t), the output signal $y_{dis}$(t) may be distorted by the non-linear behavior of the amplifier element 303 and/or the bandlimiting effect of the filter element 305. Furthermore, the output signal $y_{dis}$(t) may also be distorted by the bandlimiting effect of the filter element 306.

Derivation of Pre-Distorter 300

Figure 10:
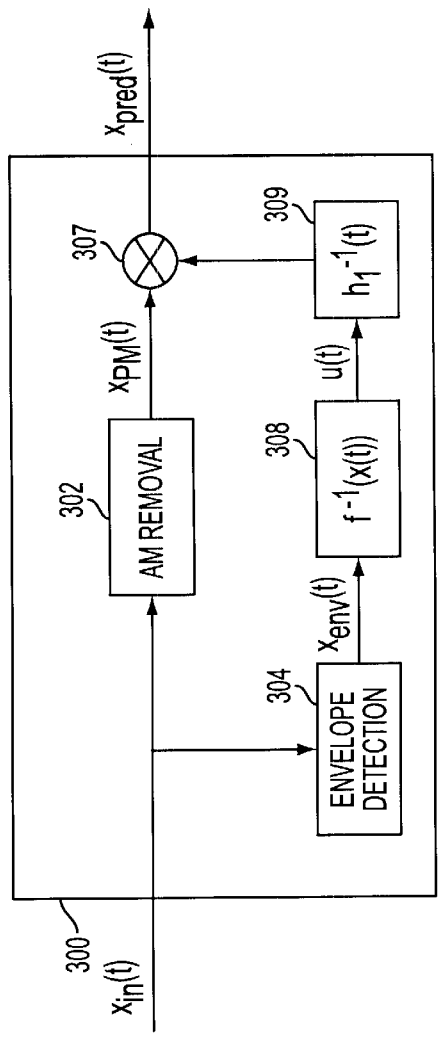
FIG. 10 shows a block diagram of the inverse configuration of the amplifier of FIG. 3.
Figure 11:
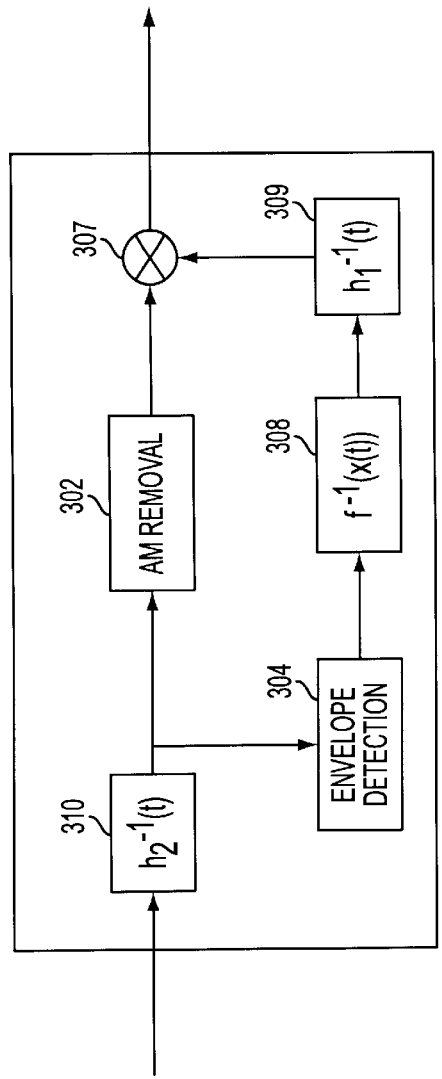
FIG. 11 shows a block diagram of the configuration of the pre-distorter of FIG. 3.

As in the derivation of the pre-distorters 100 and 200, the first step in deriving the pre-distorter 300 in FIG. 10 is to define its topology. This is done by determining the inverse topology to that of the corresponding amplifier 301 in FIG. 9. This inverse topology is shown in FIG. 11 and comprises an AM removal element 302 and an envelope detection element 304 like those in the amplifier 301. This inverse topology also comprises a mixer 307, a corresponding inverse amplifier element 308 to the amplifier element 303, a corresponding first inverse filter element 309 to the first filter element 305, and a corresponding second inverse filter element 310 to the second filter element 306. The envelope detection element 304, the inverse amplifier element 308, and the first inverse filter element 309 are cascaded to form a first path in the inverse topology. The AM removal element 302 forms a second path of the inverse topology. The first and second paths are connected to the second inverse filter via the envelope detection element 308 and the AM removal element 302, respectively. The first and second paths are combined with the mixer 307.

Similar to the derivation of the pre-distorters 100 and 200, element 303, 305, and 306 of the amplifier 301 of FIG. 9 for which compensation is desired is identified. Then, any inverse element 308, 309, or 310 corresponding to an element 303, 305, or 306 of the amplifier 301 of FIG. 9 for which compensation is not desired is removed from the topology to form the topology of the pre-distorter 100.

In the example presented here, the amplifier element 303 is assumed to have a significant non-linear behavior at the carrier frequency of the input and output signals $x_{in}$(t) and $y_{dis}$(t). This is due to the partial response f($x_b$(t)) of the amplifier element 301. Furthermore, the first filter element 305 is assumed to be a bandpass filter whose response $h_1$(t) causes a significant bandlimiting effect in the output signal $y_{dis}$(t) at the carrier frequency. However, the second filter element 306 is assumed to be a bandpass filter whose response $h_2$(t) suppresses harmonic frequencies in the output signal $y_{dis}$(t) with no significant bandlimiting effect at the carrier frequency. This means that only the partial response f($x_b$(t)) and the response $h_1$(t) of the amplifier and filter elements 303 and 305, respectively, cause significant distortion in the distorted output signal $y_{dis}$(t) at the carrier frequency. Compensation is therefore desired for the amplifier and filter elements 303 and 305 but not the filter element 306. As a result, both the inverse amplifier and filter elements 308 and 309 are used in the topology for the pre-distorter 300 of FIG. 11 but the inverse filter element 310 is not.

Similar to the amplifier 301 of FIG. 9, the AM removal element 302 and the envelope detection element 304 of the pre-distorter 300 of FIG. 11 both receive an input signal $x_{in}$(t) and split it into a PM (pulse modulation) signal $x_{PM}$(t) and an envelope signal $x_{env}$(t). To compensate for the partial response f($x_b$(t) of the amplifier element 303, the corresponding inverse amplifier element 308 has a characteristic response $f^{-1}$(x(t)) to an input signal x(t). The output signal u(t) of the inverse amplifier element 308 in response to the envelope signal $x_{env}$(t) is given by:

$$u(t) = f^{-1}(x_{env}(t)) \quad (37)$$

where $x_{env}$(t) = x(t).

The inverse filter element 309 has a characteristic response $h_1^{-1}$(t) to compensate for the response $h_1$(t) of the filter element 305. The output signal v(t) of the inverse filter element 309 in response to the output signal u(t) from the inverse amplifier element 308 is given by:

$$v(t) = h_1^{-1}(t) * u(t) = h_1^{-1}(t) * f^{-1}(x_{env}(t)) \quad (38)$$

The mixer 307 then mixes the output signal u(t) from the inverse amplifier element 308 with the PM signal $x_{PM}$(t) from the AM removal element 302. This produces the pre-distorted input signal $x_{pred}$(t) of the pre-distorter 300.

Similar to the manner in which the pre-distorters 100 and 200 of FIGS. 5 and 8 were derived, the next step is to define the responses $f^{-1}$(x(t)) and $h^{-1}$(t) for the inverse amplifier and filter elements 308 and 309 of FIG. 11. In doing so, it is necessary to develop a model of the behavior of the corresponding amplifier and filter elements 303 and 305 of FIG. 9. The following discussion details how this is done.

Like the filter element 102 of FIG. 4, the behavior of the filter element 305 can be modeled by an AR (i.e., auto regressive) filter if it is assumed to be minimum phase. Thus, the corresponding Z transform $H_1$(z) for the response $h_1$(t) can be modeled by the series expansion of Eq. (7), where $H_1$(z) = H(z) and the set of coefficients {$a_0$, ..., $a_M$} defines the response $h_1$(t). This also means that the inverse response $h_1^{-1}$(t) exists. The Z transform $H_1^{-1}$(z) of this response $h_1^{-1}$(t) of the inverse filter element 309 of the pre-distorter 300 of FIG. 11 can be modeled by the series expansion given in Eq. (8). Thus, the set of coefficients {$a_0$, ..., $a_M$} also defines the response $h_1^{-1}$(t).

Since the response $h_1^{-1}$(t) in fact exists, Eq. (33) can be re-written in the following manner:

$$x_{env}(t) = x_{con}(t) * h_1^{-1}(t) \quad (39)$$

In view of Eq. (8), Eq. (39) can be re-written to model the behavior of the filter element 305 in an inverted manner according to:

$$x_{env}(t) \approx \sum_{m=0}^{M} a_m x_{con}(t - mT) \quad (40)$$

where 1/T represents the sampling rate.

Eq. (35) can be re-written to model the behavior of the amplifier element 303 due to the partial response f($x_b$(t)) using a series expansion as follows:

$$y_{env}(t) = f(x_{con}(t)) \approx \sum_{n=0}^{N} b_n x_{con}(t)^n \quad (41)$$

where the set of coefficients $\{b_0, \ldots, b_N\}$ defines the partial response $f(x_b(t))$ of the amplifier element 303. Assuming that the inverse response $f^{-1}(f(x_{con}(t))/g)$ to the response $f(x_{con}(t))$ exists and is bounded by an input signal $f(x_{con}(t))/g$, the behavior of the amplifier element 104 can also be modeled in an inverted manner with the following series expansion:

$$x_{con}(t) = f^{-1}(y_{env}(t)) \approx \sum_{p=0}^{P} d_p \left(\frac{y_{env}(t)}{g}\right)^p \quad (42)$$

where the set of coefficients $\{d_0, \ldots, d_P\}$ defines the response $f^{-1}(x(t))$ of the inverse amplifier element 308 of the pre-distorter 300 of FIG. 11. The desired gain g of the amplifier element 303 appears in Eq. (42) so that the coefficients $\{d_0, \ldots, d_P\}$ of the response $f^{-1}(x(t))$ are properly defined not to cause amplification of the pre-distorted output signal $x_{pred}(t)$ by the gain g.

Using the assumption that the filter element 305 is minimum phase, the model of the amplifier 301 represented by Eqs. (40) to (42) is linear in its parameters. Thus, it can be easily and efficiently estimated using an LMS (i.e., least mean squares) estimation.

In performing this LMS estimation, input matrices $X_{con,1}$, $X_{con,2}$, and $Y_{env,1}$ must first be defined as follows:

$$X_{con,1} = \begin{bmatrix} x_{con}(t) & x_{con}(t-T) & \cdots & x_{con}(t-mT) \\ x_{con}(t+T) & x_{con}(t) & \cdots & x_{con}(t-(m+1)T)) \\ x_{con}(t+2T) & x_{con}(t+T) & \cdots & x_{con}(t-(m+2)T) \\ \vdots & \vdots & \ddots & \vdots \end{bmatrix} \quad (43)$$

$$X_{con,2} = \begin{bmatrix} 1 & x_{con}(t) & \cdots & x_{con}(t)^N \\ 1 & x_{con}(t+T) & \cdots & x_{con}(t+T)^N \\ 1 & x_{con}(t+2T) & \cdots & x_{con}(t+2T)^N \\ \vdots & \vdots & \ddots & \vdots \end{bmatrix} \quad (44)$$

$$Y_{env,1} = \begin{bmatrix} 1 & y_{env}(t) & \cdots & y_{env}(t)^N \\ 1 & y_{env}(t+T) & \cdots & y_{env}(t+T)^N \\ 1 & y_{env}(t+2T) & \cdots & y_{env}(t+2T)^N \\ \vdots & \vdots & \ddots & \vdots \end{bmatrix} \quad (45)$$

Correspondingly, output vectors $X_{env}$, $Y_{env,2}$) and $X_{con,3}$ must then be defined in the following manner:

$$X_{env} = \begin{bmatrix} x_{env}(t) \\ x_{env}(t+T) \\ x_{env}(t+2T) \\ \vdots \end{bmatrix} \quad (46)$$

$$Y_{env,2} = \begin{bmatrix} y_{env}(t) \\ y_{env}(t+T) \\ y_{env}(t+2T) \\ \vdots \end{bmatrix} \quad (47)$$

$$X_{con,3} = \begin{bmatrix} x_{con}(t) \\ x_{con}(t+T) \\ x_{con}(t+2T) \\ \vdots \end{bmatrix} \quad (48)$$

As will be discussed later in more detail, the elements of the matrices and vectors $X_{con,1}$, $X_{con,2}$, $Y_{env,1}$, $X_{env}$, $Y_{env,2}$, and $X_{con,3}$ are obtained by applying an input signal $x_{in}(t)$ to the amplifier 301 of FIG. 9. Measurements of the signals $x_{con}$, $y_{env}$, and $x_{env}$, $y_{env,2}$ are then made from which the elements of the matrices and vectors $X_{con,1}$, $X_{con,2}$, $Y_{env,1}$, $X_{env}$, $Y_{env,2}$, and $X_{con,3}$ are obtained. These measurements are made at the sampling rate 1/T mentioned earlier.

Eqs. (40) to (42) can now be written in matrix form according to the following relationships:

$$X_{env} = X_{con,1} \begin{bmatrix} -a_0 \\ \vdots \\ -a_M \end{bmatrix} \quad (49)$$

$$Y_{env,1} = X_{con,2} \begin{bmatrix} b_0 \\ \vdots \\ b_N \end{bmatrix} \quad (50)$$

$$X_{con,3} = Y_{env,2} \begin{bmatrix} d_0 \\ \vdots \\ d_P \end{bmatrix} \quad (51)$$

In order to obtain the coefficient vectors $[-a_0 \ldots -a_M]^T$, $[b_0 \ldots b_N]^T$, and $[d_0 \ldots d_P]^T$, the LMS solution for Eqs. (49) to (51) can be easily computed according to:

$$\begin{bmatrix} -a_0 \\ \vdots \\ -a_M \end{bmatrix} = (X_{con,1}^H X_{con,1})^{-1} X_{con,1}^H X_{env} \quad (52)$$

$$\begin{bmatrix} b_0 \\ \vdots \\ b_N \end{bmatrix} = (X_{con,2}^H X_{con,2})^{-1} X_{con,2}^H Y_{env,1} \quad (53)$$

$$\begin{bmatrix} d_0 \\ \vdots \\ d_P \end{bmatrix} = (Y_{env,2}^H Y_{env,2})^{-1} Y_{env,2}^H X_{con,3} \quad (54)$$

where the matrices $X_{con,1}^H$, $X_{con,2}^H$, and $Y_{env,2}^H$ are the respective Hermitian transposes of the matrices $X_{con,1}$, $X_{con,2}$, and $Y_{env,2}$.

In this manner, the sets of coefficients $\{b_0, \ldots, b_N\}$ and $\{a_0, \ldots, a_M\}$ are estimated for properly defining the partial response $f(x_b(t))$ and $h_1(t)$ of the amplifier and filter elements 303 and 305, respectively, of the amplifier 301 of FIG. 9. More importantly, the sets of coefficients $\{d_0, \ldots, d_P\}$ and $\{a_0, \ldots, a_M\}$ have been estimated for defining the responses $f^{-1}(x(t))$ and $h_1^{-1}(t)$ for the inverse amplifier and filter elements 308 and 309, respectively, of the pre-distorter 300 of FIG. 11. Since the set of coefficients $\{d_0, \ldots, d_P\}$ are directly estimated, the set of coefficients $\{b_0, \ldots, b_N\}$ may be optionally estimated using Eq. (53) to determine the range over which the response $f(x_b(t))$ is invertible to obtain the inverse response $f_1(x(t))$.

The behavior of the inverse amplifier and filter elements 308 and 309 can now be properly modeled by two cascaded processes. The first process is performed by the inverse amplifier element 308 and can be expressed as follows:

$$u(t) \approx [\, x_{env}(t)^0 \quad x_{env}(t)^1 \quad \cdots \quad x_{env}(t)^P \,] \begin{bmatrix} d_0 \\ d_1 \\ \vdots \\ d_P \end{bmatrix} \quad (55)$$

The second process is performed by the inverse filter element 309 and can be expressed in the following manner:

$$v(t) \approx [\, u(t-T) \quad u(t-2T) \quad \cdots \quad u(t-MT) \,] \begin{bmatrix} -a_0 \\ -a_1 \\ \vdots \\ -a_M \end{bmatrix} \quad (56)$$

Here as well, the processes only involve simple additions and multiplications. Thus, the implementation of the pre-distorter 300 with the inverse filter and amplifier elements 308 and 309 is simple and efficient.

Amplifier System 311 Topology and Operation

FIG. 3 shows an amplifier system 311 that comprises the amplifier 301 and the corresponding pre-distorter 300 that was just derived. The pre-distorter 300 pre-distorts the original input signal $x_{in}(t)$ to produce the pre-distorted input signal $x_{pred}(t)$ This done using the processes described in Eqs. (55) and (56). The pre-distorted input signal $x_{pred}(t)$ is then amplified by the amplifier 301 to produce the undistorted output signal $y_{out}(t)$ The output signal $y_{out}(t)$ is not distorted by the non-linear behavior of the amplifier element 303 and the bandlimiting effect of the filter element 305 that were compensated for with the pre-distorter 300.

Performance Evaluation of Pre-Distorter 300

Similar to the method used to derive the pre-distorter 100, the method just described for deriving the pre-distorter 300 was verified with simulations. These simulations used a characteristic response f(x) for the non-linear amplifier element 303 of the amplifier 301 of FIG. 9 given by:

$$f(x) = 5x - 2x^2 + 0.01x^3 \quad (57)$$

The characteristic responses $h_1(t)$ and $h_2(t)$ of the filter elements 305 and 306 that were used had Z transforms $H_1(z)$ and $H_2(z)$ given by:

$$H_1(z) = \frac{1}{1 - .09428z^{-1} + .3333z^{-2}} \quad (58)$$

$$H_2(z) = \frac{1}{1 - .1z^{-1}} \quad (59)$$

In view of the responses f(x(t)) and $h_1(t)$ given by Eqs. (57) and (58), the filter element 305 will cause very little distortion while the amplifier element 303 will cause significant distortion if the input signal $x_{in}(t)$ is narrow band. On the other hand, if the input signal $x_{in}(t)$ is wide band, the filter element 305 will cause significant distortion while the amplifier element 303 will not.

The input signal $x_{in}(t)$ used for the simulations comprised a normalized two-tone single-sideband signal. To show the effects of the different types of distortion just described, the frequency spacing $\Delta f$ of the two tones was varied. Specifically, the frequency spacing $\Delta f$ varied between 0.01 (1/T) and 0.10(1/T), where 1/T is the sampling rate.

For each frequency spacing $\Delta f$, a corresponding simulation of the amplifier 300 was performed using the responses f(x(t)), $h_1(t)$, and $h_2(t)$ just described. Measurements of the signals $x_{con}$, $y_{env}$, and $x_{env}$, $y_{env,2}$ were made for each simulation for obtaining the elements of the matrices and vectors $C_{con,1}$, $X_{con,2}$, $Y_{env,1}$, $X_{env}$, $Y_{env,2}$, and $X_{con,3}$. Then, for each simulation, pre-distorters 300 with orders P=0 (i.e., no pre-distortion), 3, and 11 were derived in the manner described earlier.

Figure 12:
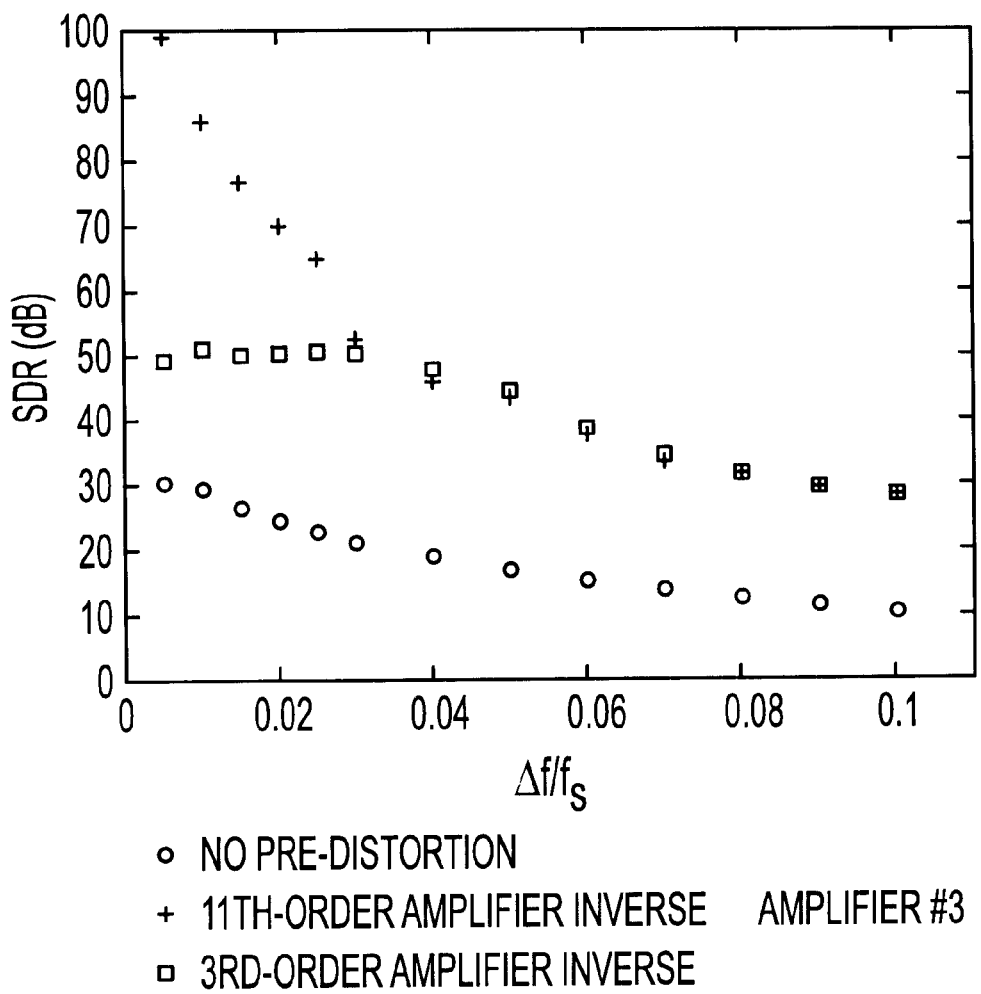
FIG. 12 shows the performance of the pre-distorter of FIG. 11.

To evaluate the performances of the pre-distorters 300 for each simulation, the signal to distortion ratio given in Eq. (26) is used. FIG. 12 shows these performances. When no pre-distortion is used (i.e., P=0), the SDR decreases as the signal frequency spacing $\Delta f$ increases. This is to be expected considering the bandlimiting effect of the response $h_1(t)$ of the filter element 305. For a relative frequency spacing $\Delta f$ of less than 0.04, the pre-distorter 300 of order P=11 is superior to that of order P=3. When the spacing is more that 0.04, the different pre-distorters 300 are equivalent due to frequency folding.

Alternative Estimation Techniques

The set of coefficients $\{d_0, \ldots, d_P\}$ may be indirectly estimated in a similar manner to that described earlier for the pre-distorter 100 of FIG. 5. In this case, Eqs. (30) to (32) would also be used, except that the matrix $Z_3$ and the vector $X_2$ would be replaced by the matrix $Y_{env,2}$ and the vector $X_{con,3}$, respectively.

Furthermore, as with the pre-distorter 100 of FIG. 5, RLS or GAL estimations may be used to obtain the coefficient vectors $[b_0 \ldots b_N]$, $[-a_0 \ldots -a_M]^T$, and $[d_0 \ldots d_P]^T$. In this way, the matrix inversions used in the LMS estimations for solving Eqs. (52) to (54). Furthermore, SVDs (i.e., singular value decomposition) of the matrices $X_{con,1}{}^H X_{con,1}$, $X_{con,2}{}^H X_{con,2}$, and $Y_{env,2}{}^H Y_{env,2}$ in Eqs. (52) to (54) can be used for the same reasons as those expressed earlier for the pre-distorter 100.

Alternative Topology for Pre-Distorter 300

In the earlier example, compensation was desired for the amplifier and filter elements 303 and 305 but not the filter element 306. As a result, corresponding inverse amplifier and filer elements 308 and 309 were utilized in the pre-distorter 300.

However, as mentioned earlier, it may be desired to compensate for only one of or any combination of the amplifier element 303, the first filter element 305, and the second filter element 306. For example, if the bandlimiting effect of the filter element 306 also causes significant distortion in the output signal $y_{dis}(t)$ at the carrier frequency, then compensation for it may be desired with the inverse filter element 310 of FIG. 10 and the pre-distorter 300 would have the topology shown in FIG. 11. In this case, the characteristic response $h_2^{-1}(t)$ of the inverse filter element 310 would be derived in a similar manner to that in which the response $h_1^{-1}(t)$ was derived.

Conclusion

The method disclosed herein for deriving a corresponding pre-distorter for a non-linear amplifier has a number of distinct advantages. These are discussed in detail next.

First, manufacturers do not have to make perfectly linear amplifiers because their non-linearities can be compensated for with corresponding pre-distorters. This allows the manufacturers to make cheaper and simpler designs of amplifiers.

Second, the method is adaptive since the method is dependent on making measurements of an amplifier to derive the corresponding pre-distorter. Thus, the aging of the elements of an amplifier is not a problem since the pre-distorter can be continually adjusted based on new measurements. In this way, an amplifier system comprising the amplifier and the pre-distorter can stay linear over its life span. Similarly, the method can be applied to existing amplifiers in order to improve their linearity without any changes to the amplifiers.

Finally, pre-distorters derived with this method are much easier to implement than those using the standard approach described earlier. Specifically, a pre-distorter derived using this method does not have to implement the kernels of the Volterra operator for the corresponding nonlinear amplifier and the inverse kernel of the first kernel of the Volterra operator for the non-linear amplifier.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of deriving a corresponding pre-distorter to a non-linear amplifier, the non-linear amplifier having a topology comprising filter and non-linear amplifier elements, the method comprising the steps of:

defining the pre-distorter's topology by:
  determining a corresponding inverse topology to the non-linear amplifier's topology, the inverse topology comprising corresponding inverse filter and amplifier elements to the amplifier's filter and non-linear amplifier elements;
  selecting each of the filter and non-linear amplifier elements for which compensation with the pre-distorter is desired; and
  removing from the inverse topology any of the inverse filter and amplifier elements corresponding to one of the filter and non-linear amplifier elements that was not identified so as to form the pre-distorter's topology, the pre-distorter's topology comprising each of the inverse filter and amplifier elements corresponding to one of the identified filter and non-linear elements;

define the identified inverse filter and amplifier elements' responses by:
  applying an input signal to the non-linear amplifier and making measurements of selected signals of the non-linear amplifier; and
  estimating their respective sets of coefficients based on the measurements.

2. The method of claim 1 wherein the input signal is the type of input signal that will be used in actual operating conditions for the non-linear amplifier.

3. The method of claim 1 wherein at least one amplifier element is selected for compensation.

4. The method of claim 1 wherein at least one filter element is selected for compensation.

5. A corresponding pre-distorter to a non-linear amplifier, the non-linear amplifier having a topology comprising filter and non-linear amplifier elements, the pre-distorter comprising:

a topology defined by:
  determining a corresponding inverse topology to the non-linear amplifier's topology, the inverse topology comprising corresponding inverse filter and ampli-fier elements to the amplifier's filter and non-linear amplifier elements;
  selecting each of the filter and nonlinear amplifier elements for which compensation with the pre-distorter is desired; and
  removing from the inverse topology any of the inverse filter and amplifier elements corresponding to one of the filter and non-linear amplifier elements that was not identified so as to form the pre-distorter's topology, the pre-distorter's topology comprising each of the inverse filter and amplifier elements corresponding to one of the identified filter and non-linear elements;

responses for the identified inverse filter and amplifier elements' defined by:
  applying an input signal to the non-linear amplifier and making measurements of selected signals of the non-linear amplifier; and
  estimating their respective sets of coefficients based on the measurements.

6. The pre-distorter of claim 5 wherein the input signal is the type of input signal that will be used in actual operating conditions for the non-linear amplifier.

7. The pre-distorter of claim 5 wherein at least one amplifier element is selected for compensation.

8. The pre-distorter of claim 5 wherein at least one filter element is selected for compensation.

9. A method of compensating for distortion caused by a non-linear amplifier exhibiting filter and non-linear amplifier characteristics, the method comprising:

deriving a pre-distorter, the pre-distorter exhibiting inverse filter and inverse non-linear amplifier characteristics, that acts on an input signal to generate a pre-distorted signal, wherein said pre-distorter compensates for distortion caused by the non-linear amplifier when said non-linear amplifier receives and amplifies said pre-distorted signal from said pre-distorter;

defining the pre-distorter's inverse filter and inverse non-linear amplifier characteristics by:
  developing a model of the non-linear amplifier's filter and non-linear amplifier characteristics;
  developing a model of the pre-distorter's corresponding inverse filter and inverse non-linear amplifier characteristics;
  applying a calibration signal directly to the non-linear amplifier and making measurements of selected signals; and
  estimating coefficients for the pre-distorter's inverse filter and inverse non-linear amplifier characteristics based on the measurements.

10. The method of claim 9, wherein the non-linear amplifier's first filter and non-linear amplifier characteristics correspond to filter and non-linear amplifier elements, and the pre-distorter's filter and non-linear amplifier characteristics correspond to inverse filter and inverse non-linear amplifier elements, said pre-distorter's elements and their arrangement being defined by:

determining a corresponding inverse arrangement of elements to the non-linear amplifier's arrangements of elements;

selecting each of the filter and non-linear amplifier elements for which compensation with the pre-distorter is desired and;

removing from the inverse arrangement any of the inverse filter and inverse non-linear amplifier elements corresponding to one of the filter and non-linear amplifier elements that was not identified so as to form the pre-distorter's arrangement of elements, the pre-distorter's arrangement of elements comprising each of the inverse filter and inverse non-linear amplifier elements corresponding to one of the selected filter and non-linear elements.

11. The method of claim 9, wherein the calibration signal is the type of signal that will be used in actual operating conditions for the non-linear amplifier.

12. The method of claim 10, wherein at least one amplifier element is selected for compensation.

13. The method of claim 10, wherein at least one filter element is selected for compensation.

14. A pre-distorter to a non-linear amplifier, the non-linear amplifier having an arrangement of filter and non-linear amplifier elements, the pre-distorter comprising:
  an arrangement of inverse filter and inverse non-linear amplifier elements that acts on a signal to generate a pre-distorted signal, wherein said pre-distorter compensates for distortion caused by the non-linear amplifier when said non-linear amplifier amplifies said pre-distorted signal;
  the inverse filter and inverse non-linear amplifier elements having responses defined by:
    applying a calibration signal directly to the non-linear amplifier and making measurements of selected signals; and
    estimating coefficients for the pre-distorter's inverse filter and inverse non-linear amplifier elements based on the measurements.

15. The pre-distorter of claim 14, wherein the pre-distorter comprises:
  inverse topology to the non-linear amplifier's topology, the inverse topology comprising inverse filter and inverse non-linear amplifier elements corresponding to selected of the non-linear amplifier's filter and non-linear amplifier elements;
  said inverse topology comprising an arrangement of said inverse filter and inverse non-linear amplifier elements opposite to the arrangement of filter and non-linear amplifier elements in the non-linear amplifier, such that the inverse filter and inverse non-linear amplifier elements operate on a signal in the opposite order as the filter and non-linear amplifier elements to which they correspond in the non-linear amplifier.

16. The pre-distorter of claim 15, wherein the calibration signal is the type of signal that will be used in actual operating conditions for the non-linear amplifier.

17. The pre-distorter of claim 15, wherein at least one amplifier element is selected for compensation.

18. The pre-distorter of claim 15, wherein at least one filter element is selected for compensation.

19. A pre-distorter for a non-linear amplifier, the non-linear amplifier comprising filter elements and non-linear amplifier elements, the pre-distorter comprising inverse filter elements and inverse non-linear amplifier elements, wherein:
  the inverse filter elements are based on selected filter elements;
  the inverse non-linear amplifier elements are based on selected non-linear amplifier elements;
  each of the inverse filter elements correspond directly to one of the selected filter elements;
  each of the inverse non-linear amplifier elements correspond directly to one of the selected non-linear amplifier elements;
  the inverse filter elements and the inverse non-linear amplifier elements are arranged within the pre-distorter such that they operate on a signal in opposite succession as the selected filter elements and the selected non-linear amplifier elements to which they correspond within the non-linear amplifier;
  each inverse filter element exhibiting a response defined as the inverse of the response of the filter element to which it corresponds; and
  each inverse non-linear amplifier element exhibiting a response defined as the inverse of the response of the non-linear amplifier element to which it corresponds.

20. The pre-distorter of claim 19, wherein:
the selected filter elements and the selected non-linear amplifier elements are chosen based on their contribution to distortion of a signal.

21. The pre-distorter of claim 19, wherein:
the inverse non-linear amplifier elements' responses and the inverse filter elements' responses are defined using measurements of selected signals after a calibration signal is received directly by the non-linear amplifier.

22. The pre-distorter of claim 21, wherein:
said definition is based, at least in part, on:
  models of the selected non-linear amplifier elements and selected filter elements based, at least in part, on a series representation of said elements;
  corresponding inverse models for the inverse non-linear amplifier elements and inverse filter elements based, at least in part, on a series representation of said elements;
  estimated coefficients for the inverse non-linear amplifier elements and inverse filter elements derived from said measurements.

23. The pre-distorter of claim 22, wherein
before said measurements are taken, choosing an order for the inverse non-linear amplifier elements' models, the order determining how many coefficients are needed to describe the inverse non-linear amplifier elements.

24. The pre-distorter of claim 21, wherein:
the non-linear amplifier comprises:
  a filter element that receives a non-linear amplifier input signal and generates a first filtered signal;
  a non-linear amplifier element that receives the first filtered signal and generates a first output signal;
the pre-distorter comprises:
  an inverse filter element that receives an input signal and generates an inverse filtered signal;
  an inverse non-linear amplifier element that receives an inverse filtered signal and generates the non-linear amplifier input signal.

25. The pre-distorter of claim 24, wherein the measurements made comprise:
samples of the calibration signal applied directly to the non-linear amplifier; and
samples of the output signal.

26. The pre-distorter of claim 21, wherein:
the non-linear amplifier comprises two or more sub-amplifiers each sub-amplifier comprising:
  a filter element that receives a sub-amplifier input signal and generates a filtered signal;
  a non-linear amplifier element that receives the filtered signal and generates an output signal;
the sub-amplifiers are cascaded to form the non-linear amplifier, wherein for each sub-amplifier, the output signal is the sub-amplifier input signal to the next sub-amplifier;

the pre-distorter comprises two or more corresponding sub-pre-distorters wherein each sub-pre-distorter comprises:
   an inverse filter element that receives a sub-pre-distorter input signal and generates an inverse filtered signal;
   an inverse non-linear amplifier element that receives an inverse filtered signal and generates a sub-pre-distorter output signal;
the sub-pre-distorters are then cascaded in opposite order to that of the sub-amplifiers to form the pre-distorter, for each sub-pre-distorter except final sub-pre-distorter, the sub-pre-distorter output signal is the sub-pre-distorter input signal to next sub-pre-distorter, the final output signal from the final sub-pre-distorter is the sub-amplifier input signal to be provided to the first sub-amplifier.

27. The pre-distorter of claim 26, wherein the measurements made comprise:
   samples of the calibration signal applied directly to the non-linear amplifier; and
   samples of the output signal of each sub-amplifier.

28. The pre-distorter of claim 21, wherein:
the non-linear amplifier is an envelop elimination and restoration non-linear amplifier comprising:
   an AM removal element receiving a non-linear amplifier input signal and generating a pulse-modulated signal;
   an envelope detection element receiving a non-linear amplifier input signal and generating an envelope signal;
   a first filter element receiving an envelope signal and generating a control signal;
   a non-linear amplifier element receiving the pulse-modulated signal and the control signal and generating an amplified signal;
   a second filter element receiving the amplified signal and generating a non-linear amplifier output signal;
the pre-distorter comprising:
   an AM removal element receiving a pre-distorter input signal and generating a pulse-modulated signal;
   an envelope detection element receiving a pre-distorter input signal and generating an envelope signal;
   an inverse non-linear amplifier element receiving the envelope signal and generating a corrected envelope signal;
   a first inverse filter element receiving the corrected envelope signal and generating a filtered corrected envelope signal;
   a mixer receiving the pulse-modulated signal and the filtered corrected envelope signal and generating the non-linear amplifier input signals.

29. The pre-distorter of claim 28, the pre-distorter additionally comprising:
   a second inverse filter element receiving an input signal and generating the pre-distorter input signal.

30. The pre-distorter of claim 28, the measurements comprising:
   samples of the calibration signal applied directly to the non-linear amplifier;
   samples of the control signal;
   samples of the envelope signal;
   samples of the amplified signal.

31. A method for deriving a pre-distorter for a non-linear amplifier, the non-linear amplifier comprising filter and non-linear amplifier elements, the pre-distorter comprising inverse filter and inverse non-linear amplifier elements, by:
   determining a corresponding inverse arrangement of elements to the non-linear amplifier's arrangement of elements, the inverse arrangement comprising corresponding inverse filter and inverse non-linear amplifier elements to the amplifier's filter and non-linear amplifier elements, said inverse filter and inverse non-linear elements arranged in reverse order to their corresponding filter and non-linear amplifier elements, such that the last element to operate on a signal in the pre-distorter corresponds to the first element to operate on a signal in the non-linear amplifier;
   selecting each of the filter and non-linear amplifier elements for which compensation with the pre-distorter is desired;
   removing from the inverse arrangement of elements any of the inverse filter and inverse non-linear amplifier elements corresponding to one of the filter and non-linear amplifier elements that was not selected, such that the pre-distorter comprises inverse filter and inverse non-linear amplifier elements corresponding only to selected filter and non-linear amplifier elements,
   defining the inverse filter and inverse non-linear amplifier elements' responses by:
      applying a calibration signal directly to the non-linear amplifier and making measurements of selected signals; and
      estimating their respective sets of coefficients based on the measurements.

32. The method of claim 31, wherein:
the selected filter and non-linear amplifier elements are selected based on their contribution to the distortion of an input signal.

33. The method of claim 31, wherein:
defining the inverse filter and inverse non-linear amplifier elements' responses also comprises:
   developing a model for the selected non-linear amplifier's filter and non-linear amplifier elements based, at least in part, on a series representation;
   developing a model for the inverse filter and inverse non-linear amplifier elements based, at least in part, on a series representation; and
   choosing an order for the inverse non-linear amplifier elements, the order determining the number of coefficients necessary to describe the non-linear amplifier elements' responses.

34. The method of claim 31, wherein:
the calibration signal is based, at least in part, on the signal that will be used in actual operating conditions for the non-linear amplifier.

35. The method of claim 31, wherein:
estimating the coefficients is based, at least in part, on a least mean squares estimation.

36. The method of claim 31, wherein:
estimating the coefficients is based, at least in part, on a recursive least squares estimation.

37. The method of claim 31, wherein:
estimating the coefficients is based, at least in part, on a gradient adaptive lattice estimation.

38. The method of claim 31, wherein:
estimating the coefficients involves utilizing singular value decompositions.

* * * * *